(12) United States Patent
Grupp et al.

(10) Patent No.: US 6,958,669 B2
(45) Date of Patent: Oct. 25, 2005

(54) HERMETIC HIGH FREQUENCY MODULE AND METHOD FOR PRODUCING THE SAME

(75) Inventors: Markus Grupp, Oberdischingen (DE); Dieter Schmidt, Weissenhorn (DE)

(73) Assignee: EADS Deutschland GmbH, Ottobrunn (DE)

( * ) Notice: Subject to any disclaimer, the term of this patent is extended or adjusted under 35 U.S.C. 154(b) by 36 days.

(21) Appl. No.: 10/312,688

(22) PCT Filed: Jun. 6, 2001

(86) PCT No.: PCT/DE01/02117
§ 371 (c)(1),
(2), (4) Date: Mar. 25, 2003

(87) PCT Pub. No.: WO02/01630
PCT Pub. Date: Jan. 3, 2002

(65) Prior Publication Data
US 2003/0156804 A1 Aug. 21, 2003

(30) Foreign Application Priority Data
Jun. 28, 2000 (DE) .......................... 100 31 407

(51) Int. Cl.⁷ ............................. H01P 3/00; H01Q 1/42
(52) U.S. Cl. ...................................... 333/239; 343/872
(58) Field of Search ................... 385/100, 94; 257/728; 340/815.4; 333/239, 248; 343/872

(56) References Cited

U.S. PATENT DOCUMENTS 4,843,353 A * 6/1989 Sequeira ....................... 333/34
5,574,314 A * 11/1996 Okada et al. ................ 257/728

FOREIGN PATENT DOCUMENTS

FR 2 717 981 A 9/1995
JP 62 037950 A 2/1987

* cited by examiner

Primary Examiner—Frank G. Font
Assistant Examiner—Michael P. Mooney
(74) Attorney, Agent, or Firm—Crowell & Moring LLP

(57) ABSTRACT

The invention relates to a high frequency module with a hollow conductor structure, consisting of a housing bottom and a housing lid, preferably consisting of ceramic. The housing bottom and the housing lid are preferably coordinated with each other in terms of their expansion characteristics. The adjusting device is mounted on the housing lid for positioning on the housing bottom, and consists of a raised photosensitive resist part which tapers conically starting from the housing lid. The adjusting device engages with the hollow conductor on assembly. The layer thickness of the adjusting device is approximately 100 to 200 μm. The housing bottom and the housing lid are permanently interconnected by soldering, preferably using solders which are introduced galvanically in solder deposits. To this end, the solder is either applied locally to the housing lid surface or introduced in vias which are structured in the lid.

9 Claims, 1 Drawing Sheet

HERMETIC HIGH FREQUENCY MODULE AND METHOD FOR PRODUCING THE SAME

This application claims the priority of German patent document 100 31 407.4, filed Jun. 28, 2000 (PCT International Application No. PCT/DE01/02117, filed Jun. 6, 2001), the disclosure of which is expressly incorporated by reference herein.

BACKGROUND AND SUMMARY OF THE INVENTION

The invention relates to a high frequency module having a waveguide structure, and to a method for producing such a module. The millimeter-wave communication modules according to the invention operate, for example, in the GHz range and are used for the transmission of data in traffic engineering.

For producing metal-ceramic composite structures for waveguide uncouplings in millimeter-wave communication modules, the antenna substrates are soldered on waveguide throughfeeds in microwave housings with a hermetic closure. In currently available manufacturing processes, so-called preforms are used for a hermetic closure which are inserted as intermediate layers between the ceramic cover and the housing. Important criteria for the quality of such connections are their stability with respect to changing temperatures and their reliability in the continuous operation. In addition, the exclusion of moisture from the housing interior plays an important role with respect to the electrical operation.

International Patent Document WO 91/209699 discloses a hermetic closure of ceramic-metallic housings for integrated circuits, in which ceramic housing covers are mounted and soldered by means of gold/tin preforms. Soldering is performed at a temperature below 400° C. by means of a heating electrode which is in contact with the housing. The cover and the housing are pressed on one another during the soldering operation.

A significant disadvantage of previous manufacturing processes is the low positioning tolerance for joining individual modules, which makes automated manufacture more difficult, or even impossible. The construction of waveguide uncouplings using preforms and the registration pins normally used for precise positioning of the housing cover, increases the time required, and is acceptable only in the case of small piece numbers.

One object of the invention is to provide a manufacturing process and a high frequency module with increased positioning tolerances in the automated production of hermetic HF modules.

This and other objects and advantages are achieved by the waveguide arrangement according to the invention, which includes a high-frequency module with a waveguide structure consisting of a housing bottom and a housing cover, preferably made of ceramics. The expansion behavior of the housing bottom and the cover are coordinated with one another. For example, the housing cover will consist of aluminum oxide and the housing bottom will consist of Mo30Cu. An adjusting device is mounted on the housing cover for positioning on the housing bottom. In order to prevent corrosion, the metallic housing is modified by means of a nickel and gold layer.

The adjusting device consists of a photosensitive resist elevation which, starting from the cover surface of the housing, tapers conically. During the mounting, the adjusting device engages in the waveguide. The layer thickness of the adjusting device amounts to approximately 100 to 200 µm. The housing cover and the housing bottom are firmly connected with one another by soldering. For this purpose, solders are preferably used which are galvanically fed into solder depots. The solder is either applied locally to the housing cover surface, which is in contact with the housing bottom, or is fed into ducts that are structured in the cover.

The method according to the invention, for producing a high-frequency module, includes the following steps:

- The contact surface of the housing cover is structured with the housing bottom with a first photo resist mask for a galvanic metal deposition;
- a gold/tin layer sequence of the solder depot is deposited;
- the first photo resist mask is removed;
- a second photo resist mask is structured as the adjusting device;
- the tin surface is cleaned of oxide;
- the housing cover is centered on the waveguide and fixed;
- the housing cover is soldered to the housing bottom;
- the resist of the adjusting device is removed in a wet-chemical manner.

The resist of the adjusting device is preferably removed in a wet-chemical process, using a heated potassium hydroxide solution.

A special advantage of the invention is in its simplicity in the case of a manual construction of waveguide throughfeeds. It also permits automatic assembly of the modules for a manufacturing of larger piece numbers.

Another advantage consists of the cost-effective integration of the manufacturing steps in the manufacturing of thin-layer substrates, which constitutes a significant simplification of the assembling process.

Other objects, advantages and novel features of the present invention will become apparent from the following detailed description of the invention when considered in conjunction with the accompanying drawings.

DETAILED DESCRIPTION OF THE DRAWINGS

Figure 1:
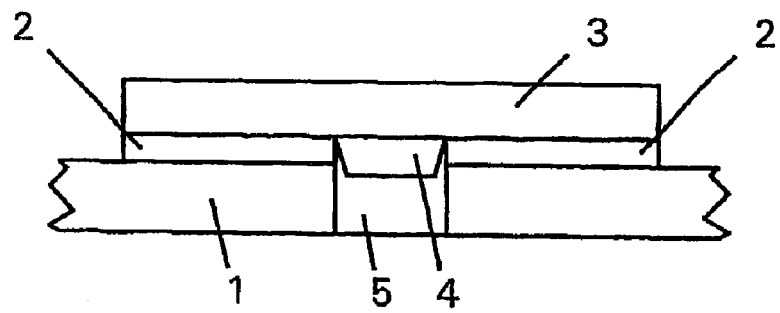
FIG. 1 is a side view of a high-frequency module with a waveguide structure.

An embodiment of the invention according to FIG. 1 illustrates a high-frequency module with a waveguide structure, consisting of a housing bottom 1 and a housing cover 3 made of ceramics. An adjusting device 4 for the positioning in the waveguide on the housing bottom 1 is applied to the housing cover 3.

Figure 2:
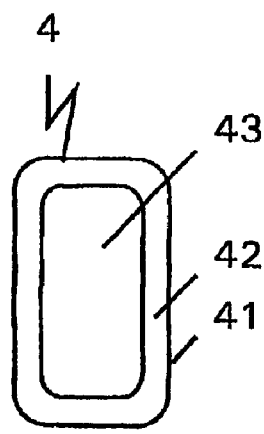
FIG. 2 is a top view of the adjusting device.

For centering and fixing on the waveguide throughfeed, the adjusting device 4 has a photosensitive resist elevation which tapers frustoconically starting from the housing cover 3 (FIG. 2). During mounting, the upper conical surface of the adjusting device 4 engages in the waveguide 5. It is guided along the lateral surface 42 to the base surface 41 and is centered with a low bearing force in the waveguide. The dimensions of the base surface 41 are coordinated in a precisely fitting manner to the dimension of the waveguide.

The layer thickness of the adjusting device 4 amounts to approximately 100 to 200 µm. To achieve such layer thicknesses, normally two or three coating films of approximately 70 μm thickness are applied on top of one another. The edge steepness of the lateral surfaces 42 is adjusted by means of the exposure parameters during the photolithographic process. The housing cover and the housing bottom 1 are fixedly connected with one another by means of solders 2 which are galvanically fed locally into solder depots 21.

Figure 3:
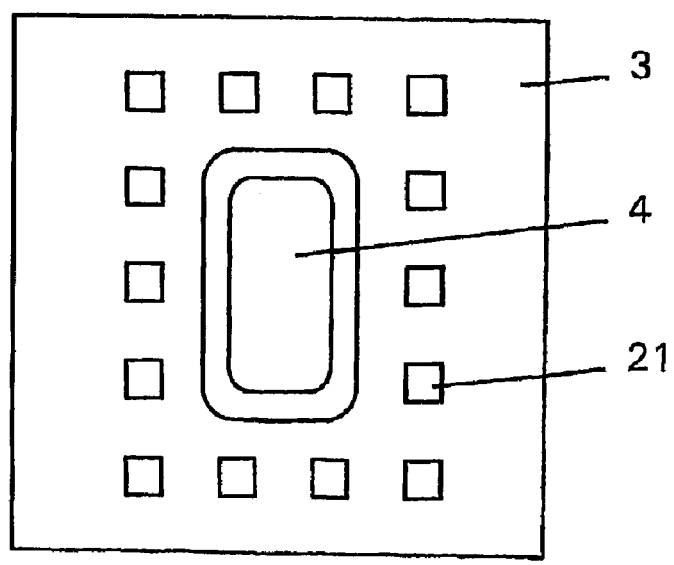
FIG. 3 is a view of the housing cover with the adjusting device and the solder depot.

The method of producing a high-frequency module according to the invention eliminates the need for use of a preform. The contact surface of the housing cover 3 is structured with the housing bottom 1 by means of a first photosensitive resist mask for a galvanic depositing of metal. The gold/tin layer sequence of the solder depot used for this purpose is deposited such that its respective thicknesses are approximately adapted to the proportions of the eutectic alloy. A layer thickness ratio of the Au:Sn layers of approximately 1.5:1 is preferably sought, and the solder depots 21 are filled thereby (FIG. 3). The respective layer thicknesses are in the range of between 12 μm Au/8 μm Sn to 9 μm Au/6 μm Sn.

After the filling of the solder depots 21, the first photo sensitive resist mask is removed again. A second photo sensitive resist mask is then structured as the adjusting device 4. The mask normally consists of a photolithographically structured coating film. The oxide surface of the tin is removed in a hydrogen vacuum reflow furnace at a temperature of approximately 300° C. and a process time of several minutes. In another process step, the housing cover 3 is centered on the waveguide 5 and fixed.

The housing cover 3 is firmly connected with the housing bottom 1 by soldering without any fluxing agent, using, for example, an AuSn soldering in a hydrogen atmosphere. The soldering process is also carried out in a hydrogen vacuum reflow furnace preferably while using the eutectic solder material of an approximate composition of 80% by volume Au and 20% by volume Sn. The melting point of the eutectic compound is approximately 280° C. The soldering process of the furnace operated in a reducing hydrogen atmosphere in connection with nitrogen as a protective gas is carried out at a temperature of approximately 320° C. for a duration of several minutes. The used gold and tin layer, which is deposited on the soldering side of the substrate in depots, and, in the course of the tempering process, results in a complete mixing of the Au/Sn layers while forming a homogeneous structure, replaces the otherwise used preforms.

The resist of the adjusting device 4 is removed in a wet-chemical manner preferably by means of a heated potassium hydroxide solution. For this purpose, the module is immersed for approximately 10 minutes in a 50% potassium hydroxide solution at a temperature of 70° C.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. High-frequency module with a waveguide structure, comprising:

a housing bottom;

a housing cover; and an adjusting device mounted on the housing cover, for positioning the housing cover on the housing bottom;

wherein the adjusting device comprises a photosensitive resist elevation.

2. The high-frequency module according to claim 1, wherein the adjusting device conically tapers starting from the housing cover.

3. High-frequency module with a waveguide structure, comprising:

a housing bottom;

a housing cover; and an adjusting device mounted on the housing cover, for positioning the housing cover on the housing bottom;

wherein the housing cover and the housing bottom are fixedly connected with one another by solders.

4. The high-frequency module according to claim 3, wherein galvanic solders are galvanically fed into solder depots.

5. The high-frequency module according to claim 1, wherein the housing cover is made of ceramics.

6. The high-frequency module according to claim 1, wherein the adjusting device engages in the waveguide.

7. The high-frequency module according to claim 1, wherein a layer thickness of the adjusting device is approximately 100 to 200 μm.

8. A method of producing a high-frequency module having a housing cover with solder depots and a housing bottom said method comprising:

structuring the contact surface of the housing cover with the housing bottom with a first photo resist mask for a galvanic metal deposition;

depositing a gold/tin layer sequence of the solder depot;

removing the first photo resist mask;

structuring a second photo resist mask as the adjusting device;

cleaning the tin surface of oxide;

centering and fixing the housing cover on the waveguide;

soldering the housing cover to the housing bottom; and removing the resist of the adjusting device in a wet-chemical manner.

9. The method according to claim 8, wherein the step of removing the resist of the adjusting device is performed using a heated potassium hydroxide solution.

* * * * *